United States Patent

Meek

[15] 3,661,741

[45] May 9, 1972

[54] FABRICATION OF INTEGRATED SEMICONDUCTOR DEVICES BY ELECTROCHEMICAL ETCHING

[72] Inventor: Ronald Lee Meek, Pottersville, N.J.

[73] Assignee: Bell Telephone Laboratories, Incorporated, Murray Hill, N.J.

[22] Filed: Oct. 7, 1970

[21] Appl. No.: 78,698

[52] U.S. Cl. ........................................204/143 GE, 148/175

[51] Int. Cl. ..........................................................B22p 1/00

[58] Field of Search .................204/143 GE, 143 R; 148/175; 317/235

[56] References Cited

UNITED STATES PATENTS

| | | | |
|---|---|---|---|
| 2,912,371 | 11/1959 | Early | 204/143 GE |
| 3,117,260 | 1/1964 | Noyce | 317/235 |
| 3,536,600 | 10/1970 | Van Dijk et al. | 204/143 R |

*Primary Examiner*—John H. Mack
*Assistant Examiner*—Neil A. Kaplan
*Attorney*—R. J. Guenther and Edwin B. Cave

[57] ABSTRACT

Grid-like zones of P or N type high conductivity material are formed in the surface of an N type higher resistivity epitaxially deposited layer on a high conductivity substrate of a body of silicon semiconductor material. The surface of the N type layer then is covered with a dielectric film of silicon nitride and a support layer of polycrystalline silicon. The body then is immersed in a suitable bath and subjected to an electrochemical etch which removes the high conductivity substrate and, in line with the grid-like zones, channels are etched through the N type layer and the grid-like zones, leaving completely isolated blocks of the N type layer affixed to a common support member. Following such shaping of isolated blocks of the N type layer integrated circuits are fabricated by applying insulating films over the exposed surface of the block and otherwise carrying out well-known EPIC-type fabrication procedures.

5 Claims, 8 Drawing Figures

STARTING MATERIAL

DIFFUSE N+ GRIDS

DEPOSIT $Si_3N_4$, POLY Si

ELECTROCHEMICALLY ETCH

N+ DIFFUSE, OXIDIZE

DEPOSIT POLY Si BOTTOM

REMOVE POLY Si AND $Si_3N_4$ TOP, OXIDIZE

INVENTOR
R. L. MEEK
BY H. W. Lockhart
ATTORNEY

FABRICATION OF INTEGRATED SEMICONDUCTOR DEVICES BY ELECTROCHEMICAL ETCHING

BACKGROUND OF THE INVENTION

1. Field of the Invention

This invention relates to a method of shaping semiconductor material by means of selective diffusion and electrochemical etching.

2. Description of the Prior Art

In the art of semiconductor device fabrication there are many applications in which precise shaping of semiconductor material by removal of material is desirable. In particular, in the fabrication of semiconductor integrated circuit devices of the type in which isolation between functional elements of a common device is achieved by dielectric means a variety of techniques have been proposed for precise removal of material. This general type of fabrication has been referred to as the EPIC type of fabrication procedure, one example being disclosed in the patent of J. J. Chang, U.S. Pat. No. 3,290,753. The principal difficulties with the EPIC-type dielectric isolation have been that a difficult and expensive precision mechanical shaping step has been necessary, and that isolation etch channels are of such a depth, of the order of mils, that utilization of available wafer area is poor.

In my application Ser. No. 59,977, filed July 31, 1970, and assigned to the same assignee as this application, reference is made to Dutch patent application No. 6703013 which discloses an electrochemical etching method for thinning semiconductor material. My copending application, above-noted, discloses an advantageous extension of this method combining ion implantation with electrochemical etching in order to fabricate thin slices of semiconductor material containing discrete conductivity type regions. In accordance with my prior application, ion implantation is used in lieu of solid state diffusion prior to the electrochemical thinning step because of the susceptibility of the conductivity type zones to electrochemical attack.

In accordance with this invention advantage is taken, however, of this selective etching effect using electrochemical means with high conductivity type zones formed typically by solid state diffusion to enable precise shaping of semiconductor material. Thus, a technique is available for accomplishing the initial material removal step of an EPIC process precisely and without respect to crystallographic orientation.

SUMMARY OF THE INVENTION

In accordance with this invention electrochemical etching is used for selective shaping or separation of silicon semiconductor material. The method relates to the standard semiconductor device starting material which almost universally presently comprises a substrate of high resistivity material, typically N+ conductivity, having on one surface thereof a thin layer of moderate or low conductivity material, typically N type.

Using standard photoresist and oxide masking procedures a grid-like zone of high conductivity N or P type material is formed in the surface of the thin N type layer, typically by solid state diffusion. If a P type grid is formed, it is significant to the invention that some high conductivity portions be exposed at the edges of the semiconductor body so as to provide a connection path during the electrochemical etching process. Conventional masking procedures result in some diffusion of the slice edge which is not photoresist masked.

In one specific embodiment for making an integrated circuit device of the so-called EPIC type having dielectric isolation, the grid diffused surface of the N type layer then is coated with a film of a suitable insulating material, for example silicon nitride. On top of the silicon nitride layer there is formed a mechanical support layer conveniently of polycrystalline silicon which may be reactively deposited.

The thus prepared silicon body then is immersed in a suitable electrochemical bath including an electrode and connection to the silicon body for a sufficient period to etch away the high conductivity substrate. The etching then continues through the N type layer in line with the grid-like zones, which also are etched away, thus producing isolated blocks of N type material mounted by way of the silicon nitride film upon the polycrystalline silicon backing piece. The chemical attack through the N type layer in line with the grid zones occur even though the grid diffusion penetrates only slightly into the N type layer. The technique thus provides a rather precise shaping of silicon semiconductor material not only for formation of isolated bodies on a common backing material as a part of an EPIC-type process of integrated circuit fabrication but also may be used for dimensionally precise separation and shaping of silicon semiconductor material.

For example, some large photoresponsive semiconductor arrays using diffused small area diodes involve the joining of a plurality of diode diffused chips in a mosaic to form a large area structure. In devices of this type which are swept by a precisely controlled beam it is important that the spacing from diode to diode be extremely uniform. In order to achieve such uniformity between diodes on different, but abutting chips, the diode to chip edge dimension must be absolutely uniform. Such uniformity can be achieved using this electrochemical etching procedure in accordance with the invention by diffusing separation grids at the same time as the active photodiodes are diffused thus fixing the dimensional uniformity.

Thus a feature of this invention is a chemical cutting tool based on the formation of zones of high conductivity of even limited depth. The grid diffused surface is not exposed to the electrolyte to produce the desired shaping.

BRIEF DESCRIPTION OF THE DRAWING

The invention, its objects and other features, will be more readily undestood from the following detailed description taken in conjunction with the drawing in which.

DETAILED DESCRIPTION

Figure 1A:
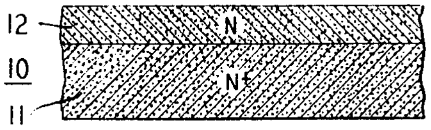
FIGS. 1A through 1G depict the successive major process steps in accordance with one embodiment of the invention. The figures represent cross sectional views of a portion of a semiconductor slice and layers of associated materials formed thereon. In particular, the process illustrated shows a part of an EPIC-type integrated circuit fabrication.

The present invention is described in terms of two specific embodiments; one relating to a dielectric isolated integrated circuit and the other a precisely spaced PN junction photoresponsive array. As previously mentioned, the starting material for a considerable volume of semiconductor device fabrication is as illustrated in FIG. 1A which shows a portion 10 of a monocrystalline silicon slice comprising a very thin layer 12 of N type conductivity silicon formed by epitaxial deposition upon a substrate layer 11 of N+ or high conductivity silicon. High conductivity silicon typically refers to impurity concentrations of $10^{18}$ atoms/cc or higher. In typical device fabrication practice the N type epitaxial layer 12 may range in thickness from 1 to 10 microns, on a substrate layer 11 of at least several mils.

Figure 1B:
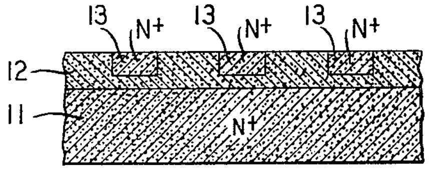
Figure 2:
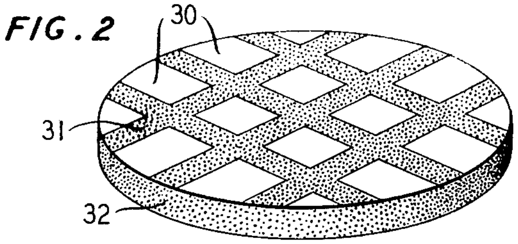
FIG. 2 is a perspective view showing a slice of semiconductor material after diffusion of grid zones.

The next step in the fabrication process comprises diffusion of a high conductivity isolation pattern, which may be of N+ or P+ conductivity type, into the surface of the N type epitaxial layer 12. This pattern in this specific embodiment comprises a simple rectilinear grid. However, it will be understood that a variety of patterns may be used depending on particular applications. The sectional view of FIG. 1B depicts N+ grid zones 13 penetrating partially through the layer 12. Referring to FIG. 2, a diffused grid 31 is depicted by the stippled portions into a slice 30 of semiconductor material. For clarity of illustration this figure shows only a 3 × 3 line grid. Obviously a much greater density is desirable in the usual 1 to 2 inch diameter semiconductor slice. FIG. 2 illustrates that in accordance with usual masking procedures, the edge 32 of the slice is subject to the diffusion which forms the grid 31. In the case of a P type grid zone this edge-diffused skin provides a necessary electrical path to the grid in the subsequently described electrochemical etching step.

The high conductivity grid zones 13 need not be diffused very deeply within the N type layer 12 in order to accomplish the desired etching effect. Inasmuch as the etching process apparently occurs by an electrochemical reaction based on carrier injection into the N layer 12, it is necessary only that there be some slight depth of high conductivity portion to constitute the injection source. For example, diffusion of the N+ grid zones 13 to a depth of 1.0 micron is sufficient to enable etch-through of an N type layer of up to 10 microns thickness.

Although not shown, it will be understood that small P type zones may be formed within the N type layer areas defined by the N+ grid zones. It is important, of course, that these diffused zones be of limited area and not be connected to portions of the N+ grid zone or exposed at the edges of the slice.

Figure 1C:
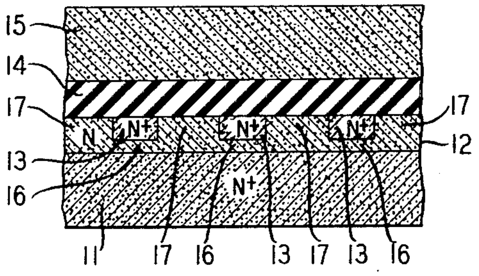

Next, as shown in FIG. 1C the N type layer is covered with an insulating film 14 for which silicon nitride is particularly suitable. Such a film may be deposited by any of several well-known reactive processes and a thickness of several thousand Angstroms is suitable. On top of the silicon nitride film a further layer 15 of polycrystalline silicon is vapor deposited to provide a mechanical support for the semiconductor body.

Figure 1D:
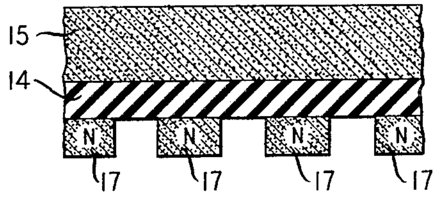

As the next step the body is immersed in an electrochemical bath generally the same as that disclosed in my copending application referred to hereinabove. In particular, suitable electrolytes for such an electrochemical bath include solutions of lithium hydroxide, potassium hydroxide, and sodium hydroxide, as well as hydrofluoric and hydrochloric acids. The concentration of the electrolyte is not critical. An electrode which is inert to and does not react with the electrolyte is connected to the negative pole of a direct current source and immersed in the bath. The N+ substrate of the semiconductor body is connected to the positive pole of the direct current source and the electrode and semiconductor body are immersed in the bath. Using voltage control, a current density is established sufficient to selectively electroetch the N+ substrate region 11. Typical current density ranges from 40 to 100 milliamps per square centimeter at 25° C. when silicon is etched with a 5 percent hydrofluoric acid bath. After removal of the N+ substrate 11 etching then proceeds through the portions 16 of the N layer 12 in line with the N+ grid zones 13 and concludes with removal of the N+ grid zones 13 leaving portions 17 of the N layer 12. The resulting structure is as shown in FIG. 1D. The body now comprises an array of isolated N type conductivity blocks 17 mounted on a common supporting member comprising insulating layer 14 and polycrystalline silicon layer 15. The configuration and spacing of the blocks 17 are determined by the initial precisely diffused N+ grid array.

Figure 1E:
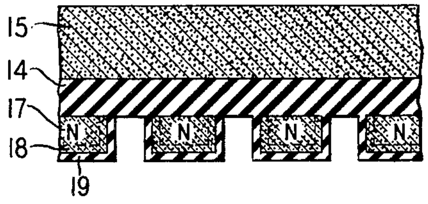
Figure 1F:
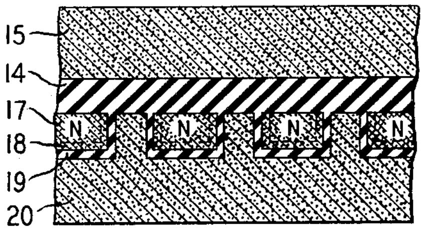
Figure 1G:
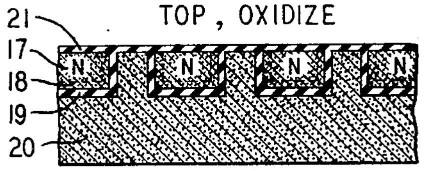

From this point in the process and starting with the structure illustrated in FIG. 1E any of several EPIC-type processes may be used to fabricate an integrated circuit device having dielectric isolation between elements. In one specific embodiment as shown in FIG. 1E the separate silicon blocks 17 are subjected to an N type diffusion to form an N+ skin 18 as a part of the final device fabrication. This N+ diffusion is followed by an oxidation step to form a film 19 of silicon oxide typically by a standard thermal conversion process, or alternatively by means of a deposition technique. This silicon oxide film provides an insulating separation and is followed as illustrated in FIG. 1F by the application of a layer 20 of polycrystalline silicon to form the final supporting layer for the integrated circuit device. Next, as shown in FIG. 1G the polycrystalline silicon support layer 15 and silicon nitride film 14 are removed from the top surface of the body using selective etchants such as hydrofluoric acid for the silicon and hot phosphoric acid for the silicon nitride layer. A suitable mask is applied to the other portions of the body during these etching processes. Finally, the structure shown in FIG. 1G having a silicon oxide film 21 on the top face is ready for additional processing including selective diffusion and deposition of metallization patterns to form the integrated circuit device.

In a further specific embodiment utilizing the unique etching phenomena in accordance with this invention a photoresponsive array or other large area semiconductor device is formed from a plurality of chips mounted in an abutting array. P+ conductivity type grid zones are diffused along with an array of small area, usually circular P type zones forming PN junction diodes in the N type layer. Inasmuch as the entire diffusion is done using a single mask, precise dimensioning between the grid zones, which are to constitute the chip edge, and the adjoining PN junction diode peripheries may be achieved. Accordingly, upon separation by the electrochemical etch along the line of the P+ type grid zones the individual chips may be placed in a mosaic array and the distance between diode rows on adjoining chips will be the same as between diode rows with a particular chip. This precision is possible using this etching technique where a similar precision cannot be achieved using mechanical separation or chemical etching means. In the case of chemical etching, mask registration on the opposite surfaces prohibits such accuracy.

In connection with the thus disclosed process of electrochemical etching it will be appreciated that there is combined a thinning technique to produce the desirable extremely thin semiconductor layers for device fabrication and at the same time there is formed a precisely shaped array of isolated silicon bodies firmly mounted on a common backing piece. The process occurs independent of any crystalline orientation as required, for example, for anisotropic etching techniques which are restricted substantially, to the [100] orientation of silicon. Also, although the disclosure has been in terms of forming conductivity type zones using solid state diffusion, ion implantation likewise may be used. Also, the electrochemical etching technique, as indicated in my copending application, is applicable to other semiconductor materials.

What is claimed is:

1. The method of shaping a body of semiconductor material for fabricating semiconductor devices comprising a. diffusing into the surface of an N type conductivity layer on an N+ conductivity substrate a high conductivity grid zone which does not extend completely through said N type layer, b. forming a layer of dielectric material on said grid diffused surface, c. introducing said body into a suitable electroetching bath and selectively electroetching said substrate, those portions of said N layer between said grid zone and said substrate, and said grid zone, leaving remaining portions of said N layer.

2. The method in accordance with claim 1 said remaining portions of said N layer constitute an array of isolated blocks.

3. The method in accordance with claim 2 including the further step of applying a layer of supporting material on said layer of dielectric material.

4. The method in accordance with claim 3 in which a layer of dielectric material is formed over said array of isolated blocks and a further supporting layer is formed over said dielectric layer.

5. Method in accordance with claim 4 in which the first formed dielectric layer and supporting layer are selectively removed.

* * * * *